United States Patent
Gorla et al.

(10) Patent No.: US 7,672,179 B1
(45) Date of Patent: Mar. 2, 2010

(54) SYSTEM AND METHOD FOR DRIVING A MEMORY CIRCUIT USING A PULL-UP RESISTANCE FOR INHIBITING A VOLTAGE DECAY ON A TRANSMISSION LINE

(75) Inventors: Gabriele Gorla, Santa Clara, CA (US); Bruce H. Lam, San Jose, CA (US)

(73) Assignee: NVIDIA Corporation, Santa Clara, CA (US)

( * ) Notice: Subject to any disclaimer, the term of this patent is extended or adjusted under 35 U.S.C. 154(b) by 237 days.

(21) Appl. No.: 11/611,791

(22) Filed: Dec. 15, 2006

(51) Int. Cl.
*G11C 7/00* (2006.01)

(52) U.S. Cl. .................. 365/198; 365/193; 365/191; 365/227; 365/229; 365/228

(58) Field of Classification Search ........... 365/193, 365/194, 198, 191, 227, 229, 228, 226
See application file for complete search history.

(56) References Cited

U.S. PATENT DOCUMENTS

| | | | | |
|---|---|---|---|---|
| 5,745,422 A * | 4/1998 | Iadanza | ................... | 365/203 |
| 6,166,988 A * | 12/2000 | Ryu et al. | ............. | 365/230.08 |
| 6,545,919 B1 * | 4/2003 | Kurosaki | ................... | 365/195 |
| 7,518,902 B2 * | 4/2009 | Hoenigschmid et al. | .... | 365/148 |
| 7,554,353 B2 * | 6/2009 | Lee et al. | ................... | 326/30 |

* cited by examiner

*Primary Examiner*—Andrew Q Tran
(74) *Attorney, Agent, or Firm*—Zilka-Kotab, PC

(57) ABSTRACT

A system, method, and computer program product are provided for driving a memory circuit. In one embodiment, the memory circuit is driven utilizing a first resistance value in a first mode of operation. Further, in a second mode of operation, the memory circuit is driven utilizing a second resistance value. In another embodiment, a device is provided for driving a memory circuit without active termination utilizing a resistor.

12 Claims, 5 Drawing Sheets

SYSTEM AND METHOD FOR DRIVING A MEMORY CIRCUIT USING A PULL-UP RESISTANCE FOR INHIBITING A VOLTAGE DECAY ON A TRANSMISSION LINE

FIELD OF THE INVENTION

The present invention relates to memory circuits, and more particularly to driving memory circuits.

BACKGROUND

Prior art FIG. 1 illustrates a system 100 for driving a memory circuit 102 in an active termination mode, in accordance with the prior art. As shown, the system 100 includes a memory circuit 102 [e.g. dynamic random access memory (DRAM), etc.]. Such memory circuit 102 is accessible by a plurality of transmission lines 106 which are capable of being strobed 104 in the manner shown. For reasons that will soon become apparent, such transmission lines 106 are each equipped with a pull up resistor 108 for supporting such active termination mode.

Prior art FIG. 2 illustrates a signal 200 for driving a memory circuit such as the one in FIG. 1, in accordance with the prior art. As illustrated, the signal is strobed during an active time period 202, during which a plurality of transitions (e.g. 6 shown) occur. Such transitions, in turn, effect the reading/writing of the memory circuit 102. One purpose of the aforementioned pull up resistor 108 of FIG. 1 is to help maintain the signal 200 in an active state 204 between strobes. Such pull up resistor 108 is typically in the realm of 40 Ohms, but may vary in different designs.

While fast, the foregoing system 100 of FIG. 1 consumes much power in such active termination mode. One potential way of reducing such power (at the cost of performance), is to operate in a non-active termination mode without the resistor 108 of FIG. 1. However, any attempt to do so results in a decay 206 of the signal 200 between the activation thereof. Unfortunately, if a time between strobes is sufficient, the foregoing decay 206 potentially results in the appearance of an additional unwanted transition 208 which, in turn, results in inaccuracies when driving the memory circuit 102.

SUMMARY

A system, method, and computer program product are provided for driving a memory circuit. In one embodiment, the memory circuit is driven utilizing a first resistance value in a first mode of operation. Further, in a second mode of operation, the memory circuit is driven utilizing a second resistance value. In another embodiment, a device is provided for driving a memory circuit without active termination utilizing a resistor.

BRIEF DESCRIPTION OF THE DRAWINGS

Prior art

Prior art

DETAILED DESCRIPTION

Figure 3:
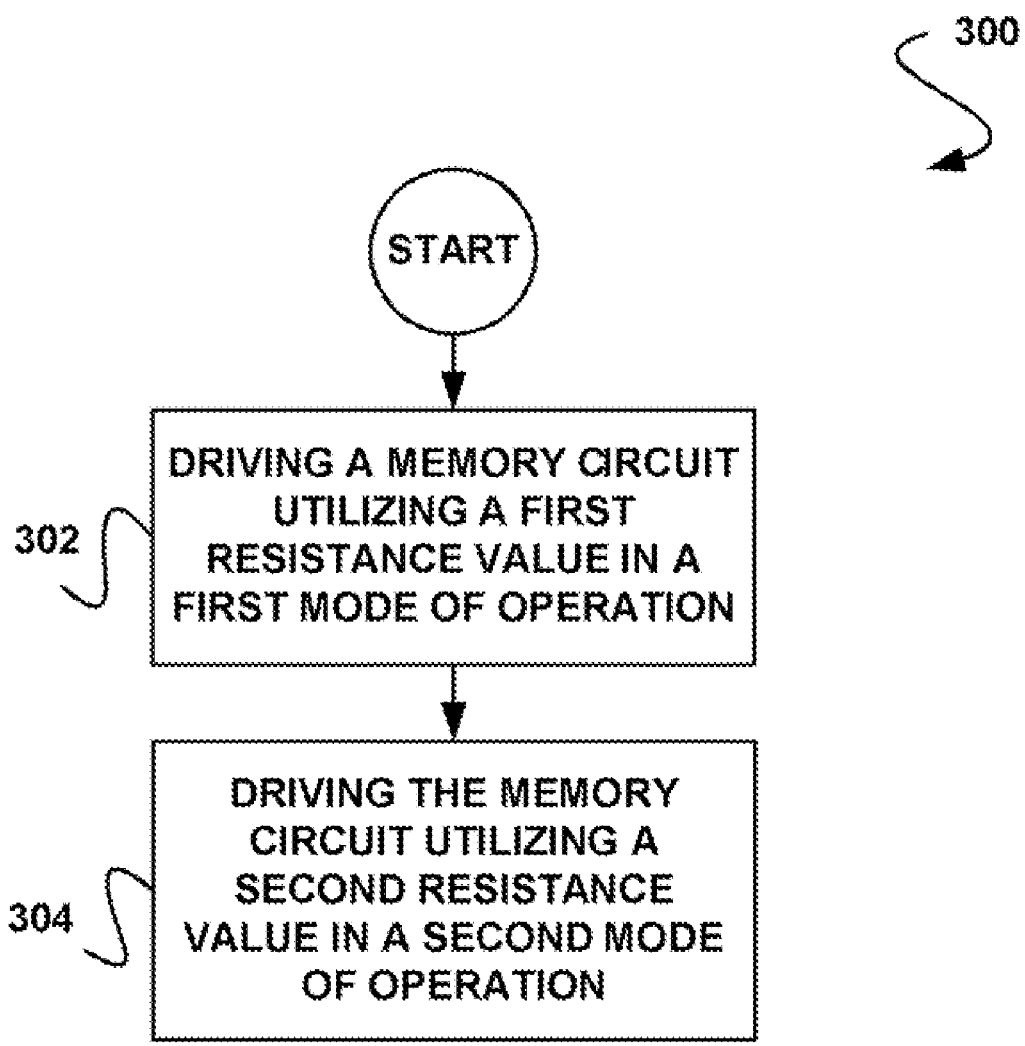
FIG. 3 shows a method for driving a memory circuit, in accordance with one embodiment.

FIG. 3 shows a method 300 for driving a memory circuit, in accordance with one embodiment. As shown, a memory circuit is driven utilizing a first resistance value in a first mode of operation. See operation 302.

In the context of the present description, the memory circuit may include any circuit capable of serving as memory. For example, in various embodiments, the memory circuit may include dynamic random access memory (DRAM), magnetic random access memory (MRAM), intelligent random access memory (IRAM), distributed network architecture (DNA) memory, window random access memory (WRAM), flash memory (e.g. NAND, NOR, or others, etc.), pseudostatic random access memory (PSRAM), wetware memory, and/or any other type of memory circuit that meets the above definition.

Further, such memory circuit may be driven in any manner that includes or results in the writing and/or reading thereof. Just by way of example, the memory circuits may be driven by various strobes. Examples of strobes include a row address strobe (RAS) that is sent to the memory circuit to identify a row address, a column address strobe (CAS) that may be used to validate a column address, etc.

Still yet, in a second mode of operation, the memory circuit is driven utilizing a second resistance value. See operation 304. In one embodiment, the second resistance value may be greater than the first resistance value. To this end, in various embodiments, such second resistance value may more effectively inhibit a decay of a voltage on a transmission line that is utilized for driving the memory circuit. This feature may optionally be used for preventing an unwanted pulse when the transmission line is activated.

In another embodiment, the first resistor may be utilized in the first mode of operation in association with active termination. Such active termination involves the use of a resistor to more closely match an impedance of the aforementioned transmission line. In various specific optional embodiments, the foregoing active termination may be defined specifically in accordance with the Joint Electron Device Engineering Council (JEDEC) GDDR, GDDR1, GDDR3, GDDR4, etc. standards. On the other hand, the second mode of operation may involve the use of the second resistor for operating without such active termination, in accordance with yet another embodiment.

In various other embodiments, the first resistance value and/or the second resistance value may refer to pull-up resistance values. It should be noted that such first and second resistance values may include any different values. For example, in one embodiment, the first resistance value may be selected to be less than 60 Ohms to accomplish the aforementioned active termination operation. Further, in such embodiment, the second resistance value may be greater than 100 Ohms. Of course, other embodiments are contemplated where the second resistance value is greater than 1K Ohms, 5K Ohms, 10K Ohms, 50K Ohms, 100K Ohms, etc.

Of course, the aforementioned resistance values may be provided in any desired manner. For example, physical resistors may be utilized, in one embodiment. In other embodiments, the resistance (and associated values) may be provided without utilizing resistors, but instead rely on other types of components (e.g. transistors, etc.). Further, the components providing the appropriate resistance values may be integrated (in silicon) as a component of the memory circuit or in another device (to be described hereinafter in greater detail). Still yet, in other embodiments, the resistance values may be provided by components that are situated on a circuit board (again, in combination with the memory circuit and/or the driving component, etc.).

In use, the first and second mode of operation may be performed as a function of any automatic and/or manual control. Just by way of example, a user may manually choose between such operations at start-up or at any time, for that matter. In other embodiments, the switch between such modes may occur automatically as a function of any desired parameter. For instance, such modes of operation may be chosen based on the level of battery power, presence of alternating power, level/type of memory activity, etc.

Still yet, the memory circuit may be driven by any entity that may or may not be part of the memory circuit and/or a system including the memory circuit. In one embodiment, the memory circuit may be driven by a central processing unit (CPU), graphics processor, etc. In another embodiment, the memory circuit may be driven by a memory controller. In a similar manner, the memory circuit itself may be a component of any of the foregoing components (or any component, for that matter), or constitute a stand-alone circuit, etc.

The foregoing embodiment is set forth in the context of multiple modes of operation. Of course, in various other embodiments, a single mode of operation is contemplated that may incorporate the various features set forth hereinabove. Further, in another embodiment, the memory circuit may be simply driven without the aforementioned active termination utilizing a resistor.

More illustrative information will now be set forth regarding various optional architectures and features of different embodiments with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 1:
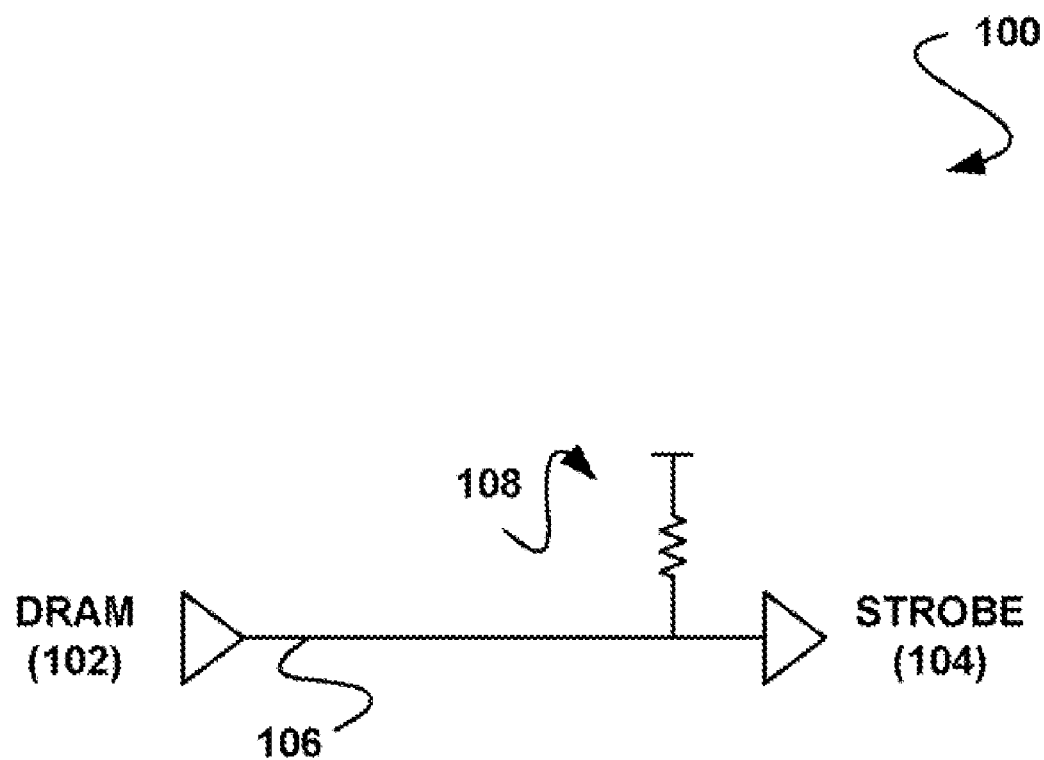
FIG. 1 illustrates a system for driving a memory circuit in an active termination mode, in accordance with the prior art.
Figure 2:
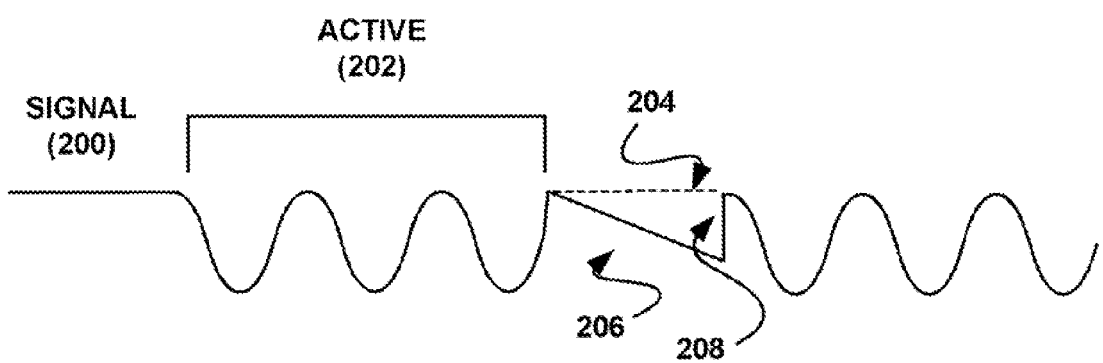
FIG. 2 illustrates a signal for driving a memory circuit such as the one in FIG. 1, in accordance with the prior art.
Figure 4A:
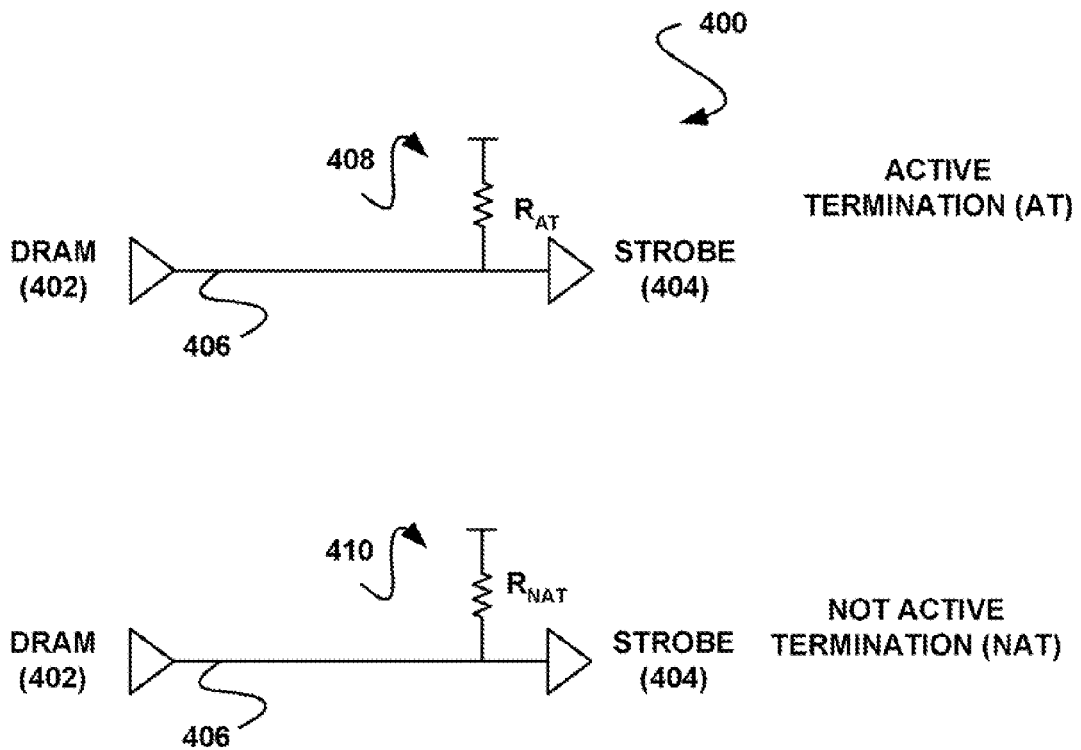
FIG. 4A shows a system for driving a memory circuit between an active termination and non-termination mode when strobing, in accordance with one embodiment.

FIG. 4A shows a system 400 for driving a memory circuit between an active termination and non-termination mode, in accordance with one embodiment. As an option, the present system 400 may be implemented to carry out the method 300 of FIG. 1. Of course, however, the system 400 may be implemented in any desired environment. For example, while two circuit configurations are shown, one may be used without the other in a single mode embodiment, etc.

As shown, DRAM 402 is provided which remains in communication with a transmission line 406 which, in turn, receives a strobe 404, for driving the DRAM 402. Again, while a DRAM is disclosed in the context of the present embodiment, it should be noted that other types of memory circuit may be substituted. As further shown, the system 400 may operate in two modes, namely an active termination (AT) mode and a non-active termination (NAT) mode.

To accomplish this, when operating in the AT mode, an appropriate AT resistor 408 may be utilized in the manner shown. Similarly, a NAT resistor 410 may be utilized when operating in the NAT mode. Of course, switching between the two resistors 408, 410 may be accomplished in any desired manner. For example, in one embodiment, one or more transistors may be configured to switch between the two resistors 408, 410 or resistance-providing components/networks, etc.

In one example of use, optimal performance may be desired at times, at the cost of any increase in power consumption. In such situations, the system 400 may be operated in AT mode utilizing the AT resistor 408.

On other hand, in other situations, power savings may be desired at certain times during operation, despite any potential sacrifice in performance. In such situations, the system 400 may be operated in NAT mode utilizing the NAT resistor 410. By utilizing the NAT resistor 410 which may be greater than the AT resistor 408, power savings is incurred, since less current is flowing through the NAT resistor 410 (with respect to the amount that would flow via the AT resistor 408).

Further, by utilizing the NAT resistor 410 (instead of no resistor at all, i.e. floating, etc.), operation is improved by at least potentially preventing the decay of any floating transmission line. As mentioned earlier, such decay may potentially result in the appearance of an additional unwanted transition when a signal drops below a Vref threshold. This, in turn, results in inaccuracies when driving the DRAM 402. In particular, the NAT resistor 410 helps maintain the associated transmission line 406 closer to a logic "1," thereby avoiding a spurious edge in a next transaction.

Figure 4B:
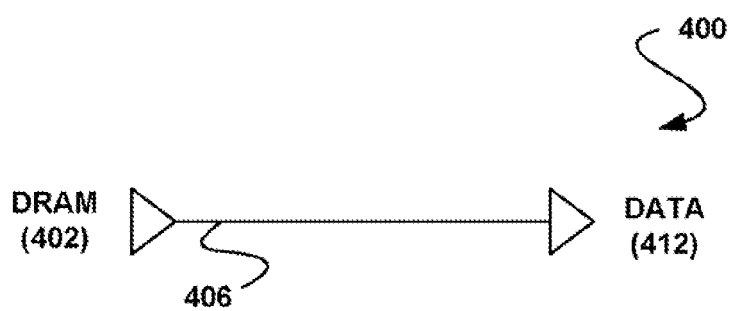
FIG. 4B shows a system for driving a memory circuit when reading/writing data, in accordance with another embodiment.

FIG. 4B shows the system 400 of FIG. 4A configured for driving a memory circuit when reading/writing data 412, in accordance with another embodiment. As shown, when reading or writing the data 412, the transmission line 406 may be devoid of any pull up resistance.

Figure 5:
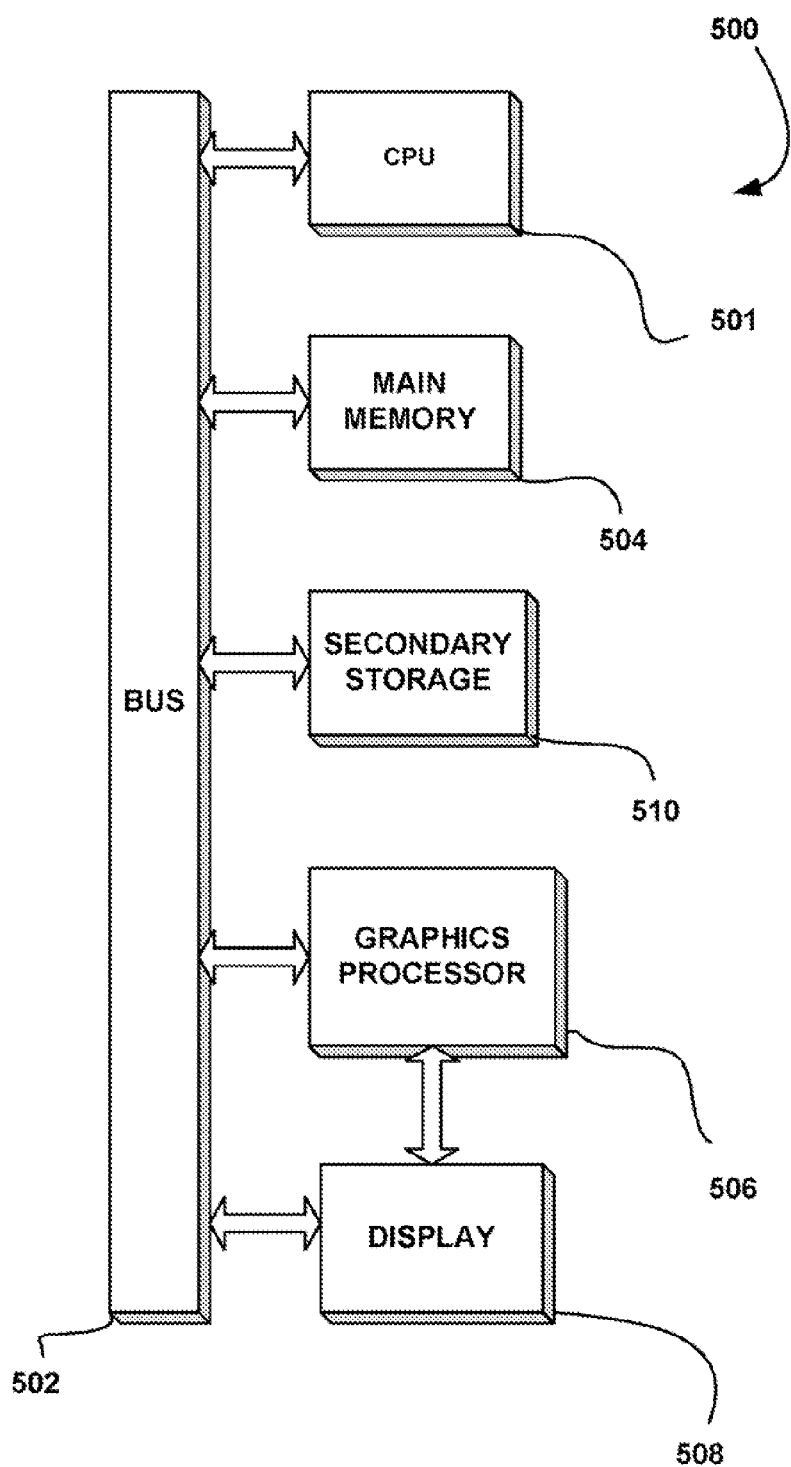
FIG. 5 illustrates an exemplary system in which the various architecture and/or functionality of the various previous embodiments may be implemented.

FIG. 5 illustrates an exemplary system 500 in which the various architecture and/or functionality of the various previous embodiments may be implemented. Of course, the system 500 may be used in any desire environment.

As shown, a system 500 is provided including at least one CPU 501 which is connected to a communication bus 502. The system 500 also includes a main memory 504. Control logic (software) and data are stored in the main memory 504 which may take the form of random access memory (RAM).

The system 500 also includes a graphics processor 506 and a display 508, i.e. a computer monitor. In one embodiment, the graphics processor 506 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 500 may also include a secondary storage 510. The secondary storage 510 includes, for example, a hard disk drive and/or a removable storage drive, representing a floppy disk drive, a magnetic tape drive, a compact disk drive, etc. The removable storage drive reads from and/or writes to a removable storage unit in a well known manner.

Computer programs, or computer control logic algorithms, may be stored in the main memory 504 and/or the secondary storage 510. Such computer programs, when executed, enable the system 500 to perform various functions. Memory 504, storage 510 and/or any other storage are possible examples of computer-readable media.

In one embodiment, the architecture and/or functionality of the various previous figures may be implemented in the context of the host processor 501, graphics processor 506, a chipset (i.e. a group of integrated circuits designed to work and sold as a unit for performing related functions, etc.), and/or any other integrated circuit for that matter.

Still yet, the architecture and/or functionality of the various previous figures may be implemented in the context of a general system, a circuit board system, a game console system dedicated for entertainment purposes, an application-specific system, and/or any other desired system. Just by way of example, the system may include a desktop computer, lap-top computer, hand-held computer, mobile phone, personal digital assistant (PDA), peripheral (e.g. printer, etc.), any component of a computer, and/or any other type of logic.

In various embodiments, the memory circuit discussed with respect to FIGS. 3-4 may take the form of any of the aforementioned memory (e.g. the main memory 504 the secondary storage 510, etc.). In other embodiments, the memory circuit may even be incorporated into or used with the abovementioned CPU 501, graphics processor 506, or any other component for that matter.

In a similar manner, the functionality of the method 300 of FIG. 3, architecture of FIGS. 4A-4B, etc. may be incorporated into such component (where the memory circuit resides), and/or any other component shown. For example, as mentioned earlier, the memory circuit may be driven by the CPU 501, graphics processor 506, a memory controller (not shown), etc. To this end, the manner in which such memory circuit is driven may be improved significantly.

While various embodiments have been described above, it should be understood that they have been presented by way of example only, and not limitation. For example, any of the network elements may employ any of the desired functionality set forth hereinabove. Thus, the breadth and scope of a preferred embodiment should not be limited by any of the above-described exemplary embodiments, but should be defined only in accordance with the following claims and their equivalents.

What is claimed is:

1. A method comprising:
   driving a memory circuit utilizing a first resistance value in a first mode of operation; and
   driving the memory circuit utilizing a second resistance value in a second mode of operation;
   wherein the first mode of operation involves active termination, the second mode of operation involves non-active termination; and
   wherein the first resistance value and the second resistance value include pull-up resistance values.

2. The method as recited in claim 1, wherein the memory circuit includes dynamic random access memory.

3. The method as recited in claim 1, wherein the driving includes reading the memory circuit.

4. The method as recited in claim 1, wherein the driving includes writing the memory circuit.

5. The method as recited in claim 1, wherein the second resistance value is greater than the first resistance value.

6. The method as recited in claim 5, wherein the second resistance value inhibits a decay of a voltage on a transmission line that is utilized for driving the memory circuit.

7. The method as recited in claim 6, wherein the decay of the voltage is inhibited for preventing an unwanted pulse when the transmission line is activated.

8. The method as recited in claim 1, wherein the memory circuit is driven by a graphics processor.

9. The method as recited in claim 1, wherein the memory circuit is driven by a memory controller.

10. The method as recited in claim 1, wherein the first resistance value is less than 60 Ohms.

11. The method as recited in claim 1, wherein the second resistance value is greater than 100 Ohms.

12. The method as recited in claim 1, wherein the second resistance value is greater than 1K Ohms.

* * * * *

UNITED STATES PATENT AND TRADEMARK OFFICE
CERTIFICATE OF CORRECTION

| | | |
|---|---|---|
| PATENT NO. | : 7,672,179 B1 | Page 1 of 1 |
| APPLICATION NO. | : 11/611791 | |
| DATED | : March 2, 2010 | |
| INVENTOR(S) | : Gorla et al. | |

It is certified that error appears in the above-identified patent and that said Letters Patent is hereby corrected as shown below:

In the claims:

Col. 6, line 13, please replace "includes dynamic" with --includes a dynamic--.

Signed and Sealed this

Thirty-first Day of May, 2011

David J. Kappos
*Director of the United States Patent and Trademark Office*